(12) United States Patent
Liu et al.

(10) Patent No.: US 8,806,389 B2
(45) Date of Patent: Aug. 12, 2014

(54) METHOD AND APPARATUS FOR MODEL BASED FLEXIBLE MRC

(71) Applicant: ASML Netherlands B.V., Veldhoven (NL)

(72) Inventors: Taihui Liu, Shenzhen (CN); Been-Der Chen, Milpitas, CA (US); Yen-Wen Lu, Los Altos, CA (US)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 13/656,635

(22) Filed: Oct. 19, 2012

(65) Prior Publication Data

US 2013/0111421 A1 May 2, 2013

Related U.S. Application Data

(60) Provisional application No. 61/549,545, filed on Oct. 20, 2011.

(51) Int. Cl.
*G06F 17/50* (2006.01)

(52) U.S. Cl.
USPC ............... 716/52; 716/50; 716/51; 716/53; 716/54; 716/55; 430/5; 430/30

(58) Field of Classification Search
USPC .............. 716/50–55, 139; 430/5, 30
See application file for complete search history.

(56) References Cited

U.S. PATENT DOCUMENTS

| 6,928,634 | B2 * | 8/2005 | Granik et al. ............... 716/52 |
| 7,707,528 | B1 | 4/2010 | White et al. |
| 7,725,845 | B1 | 5/2010 | White et al. |
| 8,336,006 | B2 * | 12/2012 | Kodera et al. .............. 716/55 |
| 8,352,888 | B2 * | 1/2013 | Liu et al. .................... 716/52 |
| 8,381,153 | B2 * | 2/2013 | Chiang et al. .............. 716/110 |
| 2007/0101303 | A1 | 5/2007 | Lien et al. |
| 2009/0172626 | A1 | 7/2009 | Pucci et al. |
| 2009/0187877 | A1 | 7/2009 | Vickery, III |
| 2009/0293037 | A1 | 11/2009 | Liu et al. |
| 2011/0167394 | A1 | 7/2011 | Lippincott |
| 2011/0185329 | A1 | 7/2011 | Wen et al. |
| 2011/0302546 | A1 | 12/2011 | Mottaez et al. |
| 2013/0000505 | A1 | 1/2013 | Tao et al. |

* cited by examiner

*Primary Examiner* — Nghia Doan
(74) *Attorney, Agent, or Firm* — Pillsbury Winthrop Shaw Pittman LLP

(57) ABSTRACT

Described herein is a method of processing a pattern layout for a lithographic process, the method comprising: identifying a feature from a plurality of features of the layout, the feature violating a pattern layout requirement; and reconfiguring the feature, wherein the reconfigured feature still violates the pattern layout requirement, the reconfiguring including evaluating a cost function that measures a lithographic metric affected by a change to the feature and a parameter characteristic of relaxation of the pattern layout requirement.

14 Claims, 6 Drawing Sheets

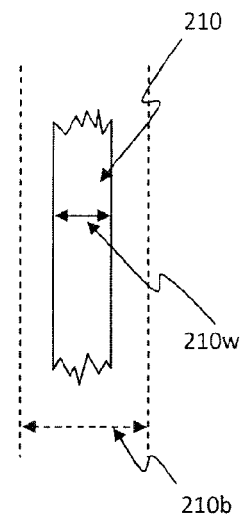
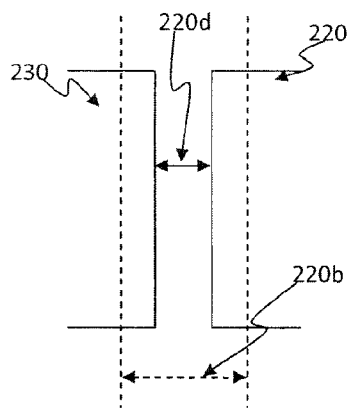
FIG. 2A  FIG. 2B
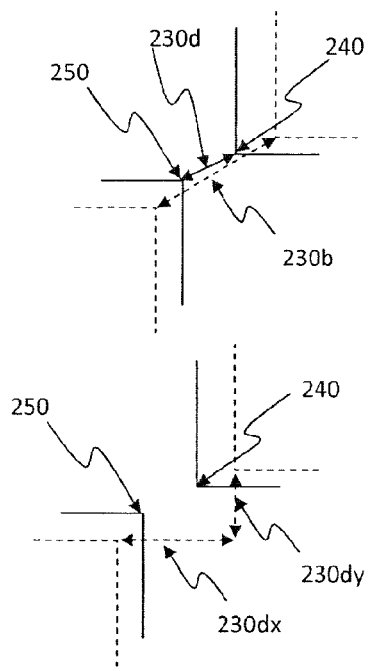
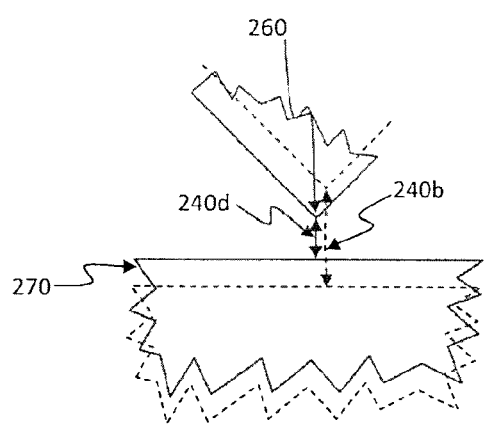
FIG. 2C  FIG. 2D

METHOD AND APPARATUS FOR MODEL BASED FLEXIBLE MRC

CROSS-REFERENCE TO RELATED APPLICATIONS

This application claims priority to U.S. Provisional Application No. 61/549,545 filed Oct. 20, 2011, which is incorporated herein by reference in its entirety.

BACKGROUND

In the semiconductor industry, microlithography (or simply lithography) is the process of printing circuit patterns on a semiconductor wafer (for example, a silicon or GaAs wafer). Currently, optical lithography is the predominant technology used in volume manufacturing of semiconductor devices and other devices such as flat-panel displays. Such lithography employs light in the visible to the deep ultraviolet spectral range to expose photosensitive resist on a substrate. In the future, extreme ultraviolet (EUV) and soft x-rays may be employed. Following exposure, the resist is developed to yield a resist image.

In optical lithography, a photomask (also called a mask or a reticle) that serves as a template for the device structures to be manufactured is first written using electron-beam or laser-beam direct-write tools. A typical photomask for optical lithography consists of a glass (or quartz) plate of six to eight inches on a side, with one surface coated with a thin metal layer (for example, chrome) of a thickness of about 100 nm. Device pattern is etched into the metal layer, hence allowing light to transmit through the clear areas. The areas where the metal layer is not etched away block light transmission. In this way, a pattern may be projected onto a semiconductor wafer.

The mask (also called "layout" or "pattern layout", which are used interchangeably hereafter) contains certain patterns and features (i.e. device features) that are used to create desired circuit patterns on a wafer. The tool used in projecting the mask image onto the wafer is called a "stepper" or "scanner" (hereinafter collectively called "exposure tool"). FIG. 1 is a diagram of an optical projection lithographic system 10 of an exposure tool. System 10 includes an illumination source 12, an illumination pupil filter 14, a lens subsystem 16a-c, a mask 18, a projection pupil filter 20, and a wafer 22 on which the aerial image of mask 18 is projected. Illumination source 12 may operate, for example, at UV (ultra-violet), DUV (deep ultra-violet) or EUV wavelengths. The light beam of illumination source 12 is expanded and scrambled before it is incident on illumination pupil 14. Illumination pupil 14 may be a simple round aperture, or may have specifically designed shapes for off-axis illumination. Off-axis illumination may include, for example, annular illumination (i.e., illumination pupil 14 is a ring with a designed inner and outer radii), quadruple illumination (i.e., illumination pupil 14 has four openings in the four quadrants of the pupil plane), and others such as dipole illumination.

After illumination pupil 14, the light passes through the illumination optics (for example, lens subsystem 16a) and is incident on mask 18, which contains the circuit pattern to be imaged on wafer 22 by the projection optics. As the desired pattern size on wafer 22 becomes smaller and smaller, and the features of the pattern become closer and closer to each other, the lithography process becomes more challenging. The projection optics (for example, lens subsystems 16b and 16c, and projection pupil filter 20) images mask 18 onto wafer 22. Pupil 20 of the projection optics limits the maximum spatial frequency of the mask pattern that can be passed through the projection optics system. A number called "numerical aperture" or NA often characterizes pupil 20.

When the resist is exposed by the projected image and thereafter baked and developed, the resist tends to undergo complex chemical and physical changes. The final resist patterns are typically characterized by their critical dimensions, or CD, usually defined as the width of a resist feature at the resist-substrate interface. While the CD is usually intended to represent the smallest feature being patterned in the given device, in practice the term CD is used to describe the linewidth of any resist feature.

In most exposure tools, the optical system reduces the size of the pattern from the mask level to the wafer level by a reduction factor, typically 4 or 5. Because of this the pattern at the mask level is typically larger than the desired pattern at the wafer level, which relaxes the dimensional control tolerances required at the mask level and improves the yield and manufacturability of the mask-making process. This reduction factor of the exposure tool introduces certain confusion in referring to "the dimension" of the exposure process. Herein, features sizes and dimensions refer to wafer-level feature sizes and dimensions, and the "minimum feature size" refers to a minimum feature at the wafer level.

For an exposure process to pattern a device correctly, the CDs of all critical structures in the device must be patterned to achieve the design target dimensions. Since it is practically impossible to achieve every target CD with no errors, the device is designed with a certain tolerance for CD errors. In this case, the pattern is considered to be acceptable if the CDs of all critical features are within these predefined tolerances. For the exposure process to be viable in a manufacturing environment, the full CD distribution must fall within the tolerance limits across a range of process conditions that represents the typical range of process variations expected to occur in the fab. For example, the actual doses of nominally identical process conditions can vary up to ±5% from the nominal dose; the actual focal planes of nominally identical process conditions can vary up to ±100 nm from the nominal focal plane.

Factors that limit or degrade the fidelity of the pattern transfer process include imperfections in the mask-making process, in the projection optics, in the resist process, and in the control of the interaction between the projected light and the film stacks formed on the wafer. However, even with a perfect mask, perfect optics, a perfect resist system, and perfect substrate reflectivity control, image fidelity becomes difficult to maintain as the dimensions of the features being imaged become smaller than the wavelength of light used in the exposure tool. For exposure processes using 193 nm illumination sources, features as small as 65 nm are desired. In this deep sub-wavelength regime, the pattern transfer process becomes highly non-linear, and the dimensions of the final pattern at the wafer level become a very sensitive function not only of the size of the pattern at the mask level, but also of the local environment of the feature, where the local environment extends out to a radius of roughly five to ten times the wavelength of light. Given the very small feature sizes compared to the wavelength, even identical structures on the mask will have different wafer-level dimensions depending on the sizes and proximities of neighboring features, and even features that are not immediately adjacent but still within the proximity region defined by the optics of the exposure tool.

SUMMARY

Described herein is a method of processing a pattern layout for a lithographic process, the method comprising: identifying a feature from a plurality of features of the layout, the feature violating a pattern layout requirement; and reconfiguring the feature, wherein the reconfigured feature still violates the pattern layout requirement, the reconfiguring including evaluating a cost function that measures a lithographic metric affected by a change to the feature and a parameter characteristic of relaxation of the pattern layout requirement. For example, the parameter characteristic of relaxation of the pattern layout requirement can be an upper bound to the amount of relaxation of the pattern layout requirement.

Also described herein is a method of processing an exposure pattern layout for a lithographic process, the method comprising: identifying a feature from a plurality of features of the layout, the feature violating a pattern layout requirement; and keeping or reconfiguring the identified feature or reconfiguring another feature wherein the kept or reconfigured identified feature still violates the pattern layout requirement.

BRIEF DESCRIPTION OF FIGURES

FIGS. 2A-2D illustrate several exemplary restraints to device patterns on a mask.

DETAILED DESCRIPTION

Figure 1:
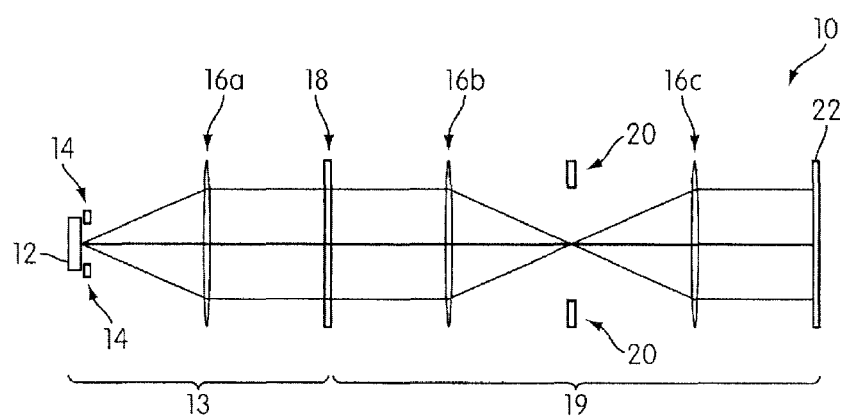
FIG. 1 is a diagram of one embodiment of a lithography system.

Device patterns on a mask can be restrained by manufacturing processes of the mask. Such restraints can be caused by many factors. For example, in a manufacturing process using laser or electron-beam, fine details of the device patterns may not be reproduced on the mask due to scattering or diffraction of the laser or electron-beam. Other factors that restrain device patterns can include etching non-uniformity of the metal layer, variations of local etchant concentration, variations of temperature, etc. These restraints (also called "pattern layout requirements" or simply "manufacturing requirements" or "mask requirements", hereafter used interchangeably) limit the shapes and locations of the device patterns on a manufacturable mask. If any of the restraints is not met, the mask is considered non-manufacturable, which actually indicates that the mask, if manufactured, is more likely to have defects. Conventional processes for verifying that a layout satisfies these restraints are sometimes referred to as manufacturing requirements check or mask requirements check (MRC) processes.

FIGS. 2A-2D describe in more detail several exemplary restraints. FIG. 2A shows a minimal width restraint. Namely, this restraint sets a lower bound $210b$ to the width $210w$ of any portion 210 of a device pattern on a manufacturable mask. Mathematically, the difference $\Delta MRC=(210w-210b)$ can be used to measure the severity of violation of this restraint. For example, if $\Delta MRC$ is zero or positive, this restraint is not violated. The more negative $\Delta MRC$ is, the more severely this restraint is violated. Of course, any other suitable mathematical form can be used to gauge the severity of violation of this restraint.

FIG. 2B shows a minimal space restraint. Namely, this restraint sets a lower bound $220b$ to the distance $220d$ of any two edges 220 and 230 of the device patterns on a manufacturable mask. The two edges 220 and 230 can be edges of the same device pattern or different device patterns. The two edges 220 and 230 are not necessarily straight edges. Mathematically, the difference $\Delta MRC=(220d-220b)$ can be used to measure the severity of violation of this restraint. For example, if $\Delta MRC$ is zero or positive, this restraint is not violated. The more negative $\Delta MRC$ is, the more severely this restraint is violated. Of course, any other suitable mathematical form can be used to gauge the severity of violation of this restraint.

FIG. 2C shows a minimal corner-to-corner space restraint. Namely, this restraint sets a lower bound $230b$ to the distance $230d$ of any two corners 240 and 250 of the device patterns on a manufacturable mask. The two corners 240 and 250 can be corners of the same device pattern or different device patterns. The two corners 240 and 250 are not necessarily right-angle corners. Mathematically, the difference $\Delta MRC=(230d-230b)$ can be used to measure the severity of violation of this restraint. For example, if $\Delta MRC$ is zero or positive, this restraint is not violated. The more negative $\Delta MRC$ is, the more severely this restraint is violated. Of course, any other suitable mathematical form can be used to gauge the severity of violation of this restraint. The distance $230d$ can be a linear distance between the two corners 240 and 250 as shown in the left panel of FIG. 2C or a root square distance (i.e., $\sqrt{(230dx)^2+(230dy)^2}$) between the two corners 240 and 250 as shown in the right panel FIG. 2C.

FIG. 2D shows a minimal corner-to-edge space restraint. Namely, this restraint sets a lower bound $240b$ to the distance $240d$ of any a corner 260 and an edge 270 of the device patterns on a manufacturable mask. The corner 260 and the edge 270 can be a corner and an edge of the same device pattern or different device patterns. The corner 260 and the edge 270 are not necessarily right-angle corner or straight edge. Mathematically, the difference $\Delta MRC=(240d-240b)$ can be used to measure the severity of violation of this restraint. For example, if $\Delta MRC$ is zero or positive, this restraint is not violated. The more negative $\Delta MRC$ is, the more severely this restraint is violated. Of course, any other suitable mathematical form can be used to gauge the severity of violation of this restraint. The distance $240d$ can be a linear distance between the corner 260 and the edge 270 in a direction perpendicular to the edge 270.

A device feature may violate any combination of mask requirements.

Some of the device features on a mask may violate one or more mask requirements, before or even after the device features on the mask undergo either a rule-based optical proximity correction (OPC) or a model-based OPC. More details of OPC can be found in commonly assigned U.S. patent application Ser. No. 13/537,005, which is hereby incorporated by reference in its entirety.

Conventional MRC processes typically use a strict approach to cause a layout to satisfy all MRC rules before a layout is verified. Moreover, conventional processes typically use a rule-based method to reconfigure violating features. According to aspects of the invention, certain features that violate one or more mask requirements are reconfigured using a model-based approach in order to reduce the severity of their violation without requiring full-mask satisfaction of all MRC rules.

According to an embodiment, these features can be reconfigured by changing one or both of the shapes and locations of these features. For example, the edges of the features may be split into a plurality of segments. During the process of reconfiguration, each segment may be moved in a direction perpendicular thereto. As shown in the diagram in FIGS. 3A and 3B, each segment can also be expanded or shrunk in a direction parallel thereto as a result of movement of nearest neighboring segments connected thereto. However, the location of each segment in the direction perpendicular thereto is sufficient to dictate changes to the shapes and locations of the features.

According to an embodiment, the features that violate one or more mask requirements can be reconfigured based on a function that measures how a lithographic metric is affected by a set of changes to these features and that measures a set of parameters characteristic of relaxation of the one or more mask requirements violated. Such a function is usually referred to as a "cost function". The cost function can have any suitable form.

In an embodiment, the cost function can assume the form in Eq. 1:

$$CF(\Delta, s) = \sum_i w_i C_i(\Delta)^2 + \sum_j v_j s_j^2, \quad (Eq.\ 1),$$

wherein $\Delta$ is the set of changes to these features; $w_i$ and $v_j$ are weight constants; $C_i$ is an i-th lithographic metric, which can be a function of $\Delta$; $s_j$ is a limit (e.g., an upper bound) to an amount of relaxation of a j-th mask requirement, and is an exemplary parameter characteristic of relaxation of the pattern layout requirement; and s is a set consisting of all $s_j$. The lithographic metric $C_i$ can be any suitable lithographic metric such as edge placement error (EPE), critical dimension uniformity, dose variation, focus variation, process condition variation, mask error (MEEF), mask complexity, resist contour distance, worst defect size, best focus shift, resist intensity, aerial intensity, resist intensity difference, aerial image difference or EPE difference.

The device features that violate one or more mask requirements can be reconfigured until a termination condition is satisfied. The termination condition includes one or more conditions selected from the group consisting of: minimization of a cost function; maximization of a cost function; reaching a preset number of iterations; reaching a value of a cost function equal to or beyond a preset threshold value; reaching a predefined computation time; and reaching a value of a cost function within an acceptable error limit.

For example, by minimizing or maximizing the cost function, optimal reconfiguration of the device features that violate one or more mask requirements and optimal mask requirement relaxation can be deduced. "Optimal reconfiguration" can be by any suitable criterion such as smallest difference between a lithographic metric and a predetermined target value of the lithographic metric. "Optimal mask requirement relaxation" can be smallest amount of relaxation.

The cost function can be minimized (or maximized for a cost function of certain form, such as $$CF(\Delta, s) = -\left(\sum_i w_i C_i(\Delta)^2 - \sum_j v_j s_j^2\right)$$

using any suitable method such as the Gauss-Newton algorithm, the interpolation method, the Levenberg-Marquardt algorithm, the gradient descent algorithm, simulated annealing, the interior point method, the genetic algorithm, solving polynomials, including higher-order polynomials of $\Delta$ and s.

Minimizing or maximizing the cost function can be under constraints. For example, the set of changes to the device features that violate one or more mask requirements can be limited between a fixed range, e.g., $\Delta_l \leq \Delta \leq \Delta_u$, wherein $\Delta_l$ and $\Delta_u$ are constants. The amount of relaxation of the j-th mask requirement $\Delta MRC_j$ can be limited as $0 \leq \Delta MRC_j(\Delta) \leq s_j$. The value of $s_j$ can be limited to a range of 0 to an upper bound constant $M_u$, i.e., $0 \leq s_j \leq M_u$. In this example, the minimization of the cost function can be expressed mathematically as deriving $$\min_{\Delta_l \leq \Delta \leq \Delta_u, 0 \leq \Delta MRC_j(\Delta)+s_j, 0 \leq s_j \leq M_u} CF(\Delta, s).$$

$$\Delta MRC_j(\Delta)$$

and the locations of the features that violate one or more mask requirements can be output for further inspection.

Figure 3A:
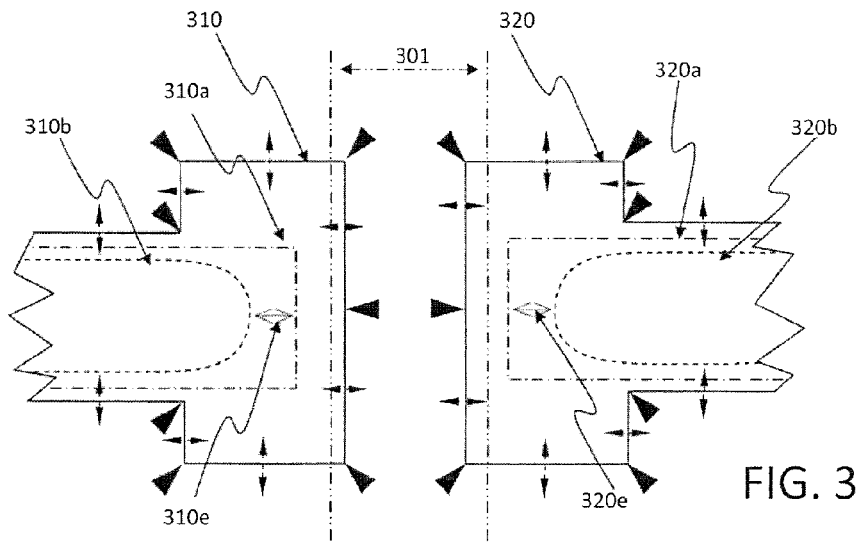
FIGS. 3A and 3B show an example of the reconfiguration process.
Figure 3B:
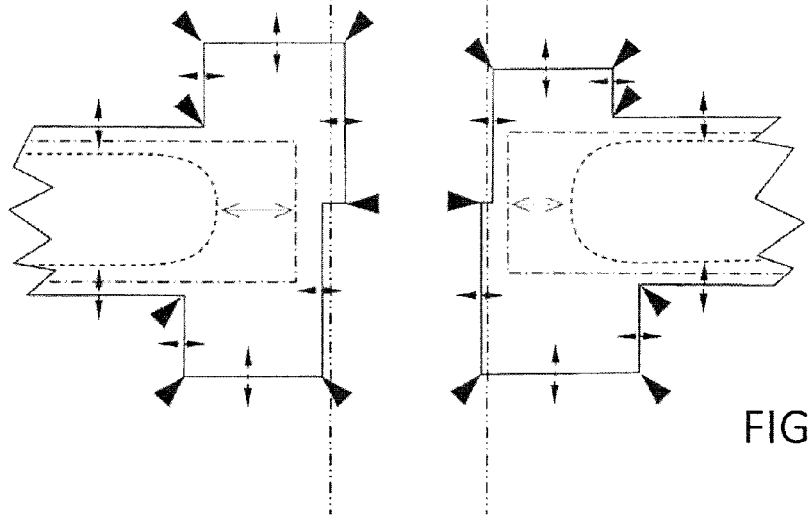

FIGS. 3A and 3B show an example of the reconfiguration process. In FIG. 3A, feature 310 and 320 violate the minimal space restraint as explained in FIG. 2B. Namely, features 310 and 320 are closer than a minimal allowed distance 301. Lines 310a and 320a are ideal resist images of features 310 and 320, respectively. Lines 310b and 320b are actual resist images of features 310 and 320, respectively. Distances 310e and 320e are edge placement errors of features 310 and 320, respectively, i.e., distances between the ideal resist images 310a and 320a and the actual resist images 310b and 320b. After the reconfiguration, as shown in FIG. 3B, features 310 and 320 still violate the minimal space restraint but by a lesser amount (distance between 310 and 320 is increased but still less than the minimal allowed distance 301); and distances 310e and 320e are increased. This reconfiguration process constitutes a compromise between optimal device features configuration and the amount of violation of the mask requirements. In the above example, the optimal device features configuration is sacrificed to an extent in order to reduce the amount of violation of the mask requirements.

Figure 4:
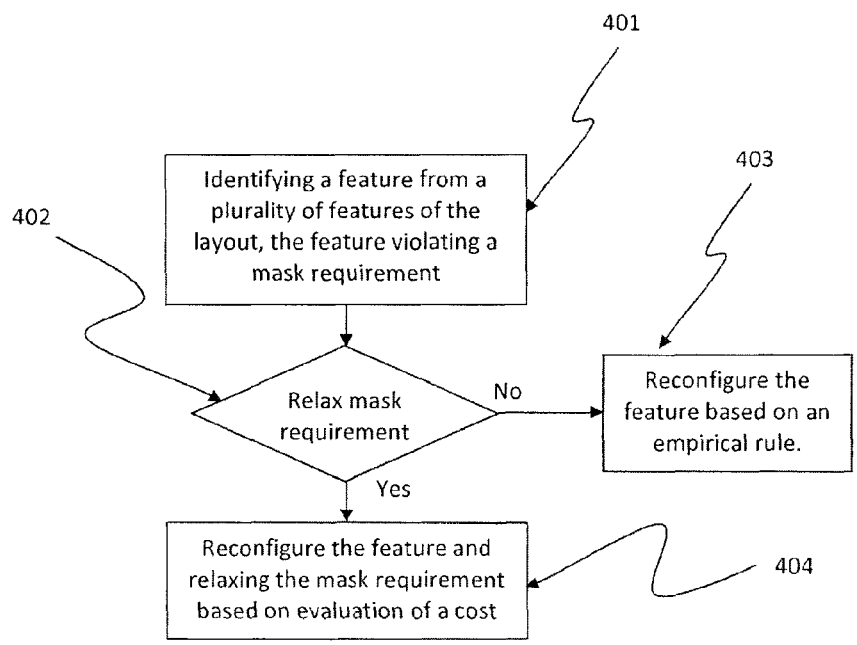
FIG. 4 shows an exemplary flowchart of a method according to an embodiment.

FIG. 4 shows an exemplary flowchart of a method according to an embodiment. In step 401, a device feature that violates one or more mask requirements is identified, for example, by checking each device feature against each mask requirement. In optional step 402, whether to relax the violated mask requirements is determined. This determination can be based on a lithographic metric. For example, if EPEs of the identified feature are less than a threshold value, the violated mask requirements are not to be relaxed, because the identified feature may simply be reconfigured based on empirical rules (step 403) such that the EPEs remain acceptable while the violation of the mask requirements is completely eliminated. If EPEs of the identified feature are greater than the threshold, reconfiguration based on empirical rules may result in unacceptable EPEs. In this situation, the violated mask requirements can be relaxed and the identified device feature may be reconfigured based on a cost function described above, so as to strike a balance between acceptable values of the lithographic metric and the amount of mask requirement violation (step 404). In one embodiment, a device feature that violates one or more mask requirements is identified; relaxation of the one or more mask requirements and reconfiguration of the identified device feature are computed based on a cost function described above and recorded; determining among applying the relaxation and the reconfiguration recorded, reconfiguring the identified device feature based on empirical rules, or not applying any reconfiguration to the identified device feature.

Figure 5:
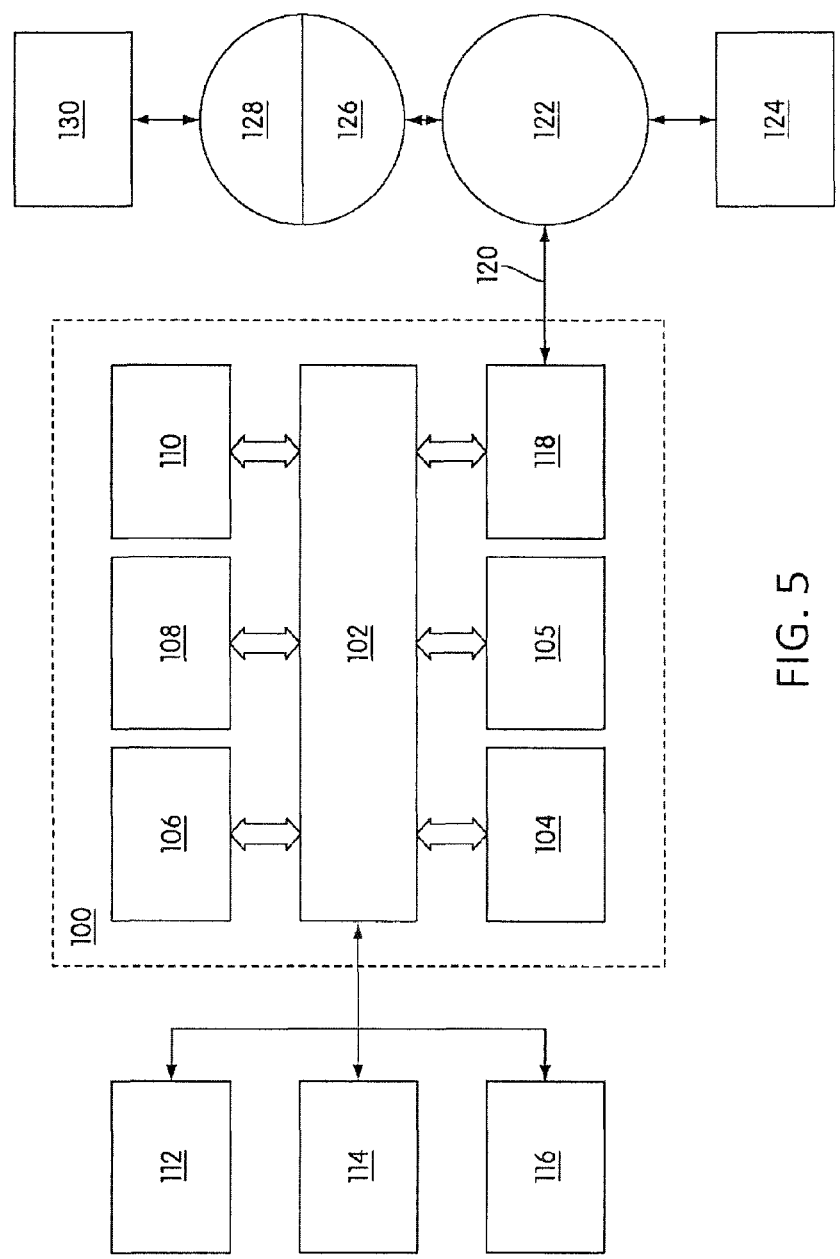
FIG. 5 is a block diagram that illustrates a computer system 100 which can assist in implementing the methods and flows disclosed herein.

FIG. 5 is a block diagram that illustrates a computer system 100 which can assist in implementing the methods and flows disclosed herein. Computer system 100 includes a bus 102 or other communication mechanism for communicating information, and a processor 104 (or multiple processors 104 and 105) coupled with bus 102 for processing information. Computer system 100 also includes a main memory 106, such as a random access memory (RAM) or other dynamic storage device, coupled to bus 102 for storing information and instructions to be executed by processor 104. Main memory 106 also may be used for storing temporary variables or other intermediate information during execution of instructions to be executed by processor 104. Computer system 100 further includes a read only memory (ROM) 108 or other static storage device coupled to bus 102 for storing static information and instructions for processor 104. A storage device 110, such as a magnetic disk or optical disk, is provided and coupled to bus 102 for storing information and instructions.

Computer system 100 may be coupled via bus 102 to a display 112, such as a cathode ray tube (CRT) or flat panel or touch panel display for displaying information to a computer user. An input device 114, including alphanumeric and other keys, is coupled to bus 102 for communicating information and command selections to processor 104. Another type of user input device is cursor control 116, such as a mouse, a trackball, or cursor direction keys for communicating direction information and command selections to processor 104 and for controlling cursor movement on display 112. This input device typically has two degrees of freedom in two axes, a first axis (e.g., x) and a second axis (e.g., y), that allows the device to specify positions in a plane. A touch panel (screen) display may also be used as an input device.

According to one embodiment, portions of the optimization process may be performed by computer system 100 in response to processor 104 executing one or more sequences of one or more instructions contained in main memory 106. Such instructions may be read into main memory 106 from another computer-readable medium, such as storage device 110. Execution of the sequences of instructions contained in main memory 106 causes processor 104 to perform the process steps described herein. One or more processors in a multi-processing arrangement may also be employed to execute the sequences of instructions contained in main memory 106. In alternative embodiments, hard-wired circuitry may be used in place of or in combination with software instructions to implement the claimed methods. Thus, the embodiments are not limited to any specific combination of hardware circuitry and software.

The term "computer-readable medium" as used herein refers to any medium that participates in providing instructions to processor 104 for execution. Such a medium may take many forms, including but not limited to, non-volatile media, volatile media, and transmission media. Non-volatile media include, for example, optical or magnetic disks, such as storage device 110. Volatile media include dynamic memory, such as main memory 106. Transmission media include coaxial cables, copper wire and fiber optics, including the wires that comprise bus 102. Transmission media can also take the form of acoustic or light waves, such as those generated during radio frequency (RF) and infrared (IR) data communications. Common forms of computer-readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, and EPROM, a FLASH-EPROM, any other memory chip or cartridge, a carrier wave as described hereinafter, or any other medium from which a computer can read.

Various forms of computer readable media may be involved in carrying one or more sequences of one or more instructions to processor 104 for execution. For example, the instructions may initially be borne on a magnetic disk of a remote computer. The remote computer can load the instructions into its dynamic memory and send the instructions over a telephone line using a modem. A modem local to computer system 100 can receive the data on the telephone line and use an infrared transmitter to convert the data to an infrared signal. An infrared detector coupled to bus 102 can receive the data carried in the infrared signal and place the data on bus 102. Bus 102 carries the data to main memory 106, from which processor 104 retrieves and executes the instructions. The instructions received by main memory 106 may optionally be stored on storage device 110 either before or after execution by processor 104.

Computer system 100 also preferably includes a communication interface 118 coupled to bus 102. Communication interface 118 provides a two-way data communication coupling to a network link 120 that is connected to a local network 122. For example, communication interface 118 may be an integrated services digital network (ISDN) card or a modem to provide a data communication connection to a corresponding type of telephone line. As another example, communication interface 118 may be a local area network (LAN) card to provide a data communication connection to a compatible LAN. Wireless links may also be implemented. In any such implementation, communication interface 118 sends and receives electrical, electromagnetic or optical signals that carry digital data streams representing various types of information.

Network link 120 typically provides data communication through one or more networks to other data devices. For example, network link 120 may provide a connection through local network 122 to a host computer 124 or to data equipment operated by an Internet Service Provider (ISP) 126. ISP 126 in turn provides data communication services through the worldwide packet data communication network, now commonly referred to as the "Internet" 128. Local network 122 and Internet 128 both use electrical, electromagnetic or optical signals that carry digital data streams. The signals through the various networks and the signals on network link 120 and through communication interface 118, which carry the digital data to and from computer system 100, are exemplary forms of carrier waves transporting the information.

Computer system 100 can send messages and receive data, including program code, through the network(s), network link 120, and communication interface 118. In the Internet example, a server 130 might transmit a requested code for an application program through Internet 128, ISP 126, local network 122 and communication interface 118. In accordance with an embodiment, one such downloaded application provides for the illumination optimization of the embodiment, for example. The received code may be executed by processor 104 as it is received, and/or stored in storage device 110, or other non-volatile storage for later execution. In this manner, computer system 100 may obtain application code in the form of a carrier wave.

Figure 6:
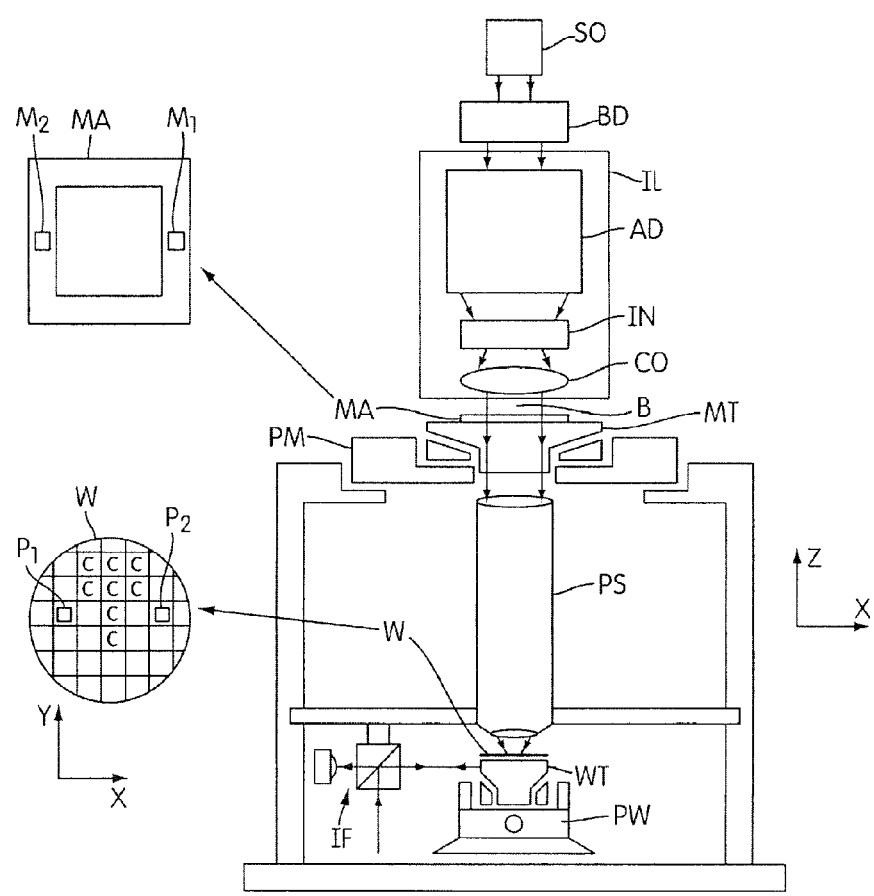
FIG. 6 schematically depicts a lithographic projection apparatus.

FIG. 6 schematically depicts a lithographic projection apparatus. The illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD configured to adjust the angular intensity distribution of the radiation beam. Generally, at least the outer and/or inner radial extent (commonly referred to as $\sigma_{outer}$ and $\sigma_{inner}$, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. Having traversed the patterning device MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the patterning device table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the patterning device table MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus could be used in at least one of the following modes. In step mode, the support structure MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure. In scan mode, the support structure MT and the substrate table WT are scanned synchronously while a pattern imparted to the radiation beam is projected onto a target portion C (i.e. a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

The concepts disclosed herein may simulate or mathematically model any generic imaging system for imaging sub wavelength features, and may be especially useful with emerging imaging technologies capable of producing wavelengths of an increasingly smaller size. Emerging technologies already in use include EUV (extreme ultra violet) lithography that is capable of producing a 193 nm wavelength with the use of an ArF laser, and even a 157 nm wavelength with the use of a Fluorine laser. Moreover, EUV lithography is capable of producing wavelengths within a range of 20-5 nm by using a synchrotron or by hitting a material (either solid or a plasma) with high energy electrons in order to produce photons within this range.

While the concepts disclosed herein may be used for imaging on a substrate such as a silicon wafer, it shall be understood that the disclosed concepts may be used with any type of lithographic imaging systems, e.g., those used for imaging on substrates other than silicon wafers.

The invention may further be described using the following clauses:

1. A method of processing a pattern layout for a lithographic process, the method comprising:
   identifying a feature from a plurality of features of the layout, the feature violating a pattern layout requirement; and
   reconfiguring the feature, wherein the reconfigured feature still violates the pattern layout requirement, the reconfiguring including evaluating a cost function of a lithographic metric affected by a change to the feature and a parameter characteristic of relaxation of the pattern layout requirement.

2. The method of clause 1, wherein the feature is reconfigured until a termination condition is satisfied.

3. The method of clause 2, wherein the termination condition includes one or more conditions selected from the group consisting of: minimization of a cost function; maximization of a cost function; reaching a preset number of iterations; reaching a value of a cost function equal to or beyond a preset threshold value; reaching a predefined computation time; and reaching a value of a cost function within an acceptable error limit.

4. The method of clause 1, further comprising determining based on a criterion whether the feature is to be reconfigured.

5. The method of any one of clauses 1 to 4, wherein the change includes movement of a segment of a boundary of the feature.

6. The method of any one of clauses 1 to 4, wherein the change includes a change of shape of the feature.

7. The method of any one of clauses 1 to 4, wherein the change includes a change of location of the feature.

8. The method of any one of clauses 1 to 4, wherein the cost function comprises a weighted sum of squares of the lithographic metric and the parameter.

9. The method of any one of clauses 1 to 4, wherein the lithographic metric is one or more metrics selected from the group consisting of: resist image intensity, aerial image intensity, edge placement error, resist image difference, aerial image difference and edge placement error difference.

10. The method of any one of clauses 1 to 4, wherein the cost function is minimized or maximized by a method selected from a group consisting of: the Gauss-Newton algorithm, the interpolation method, the Levenberg-Marquardt algorithm, the gradient descent algorithm, simulated annealing, interior point method, the genetic algorithm, solving polynomials of the changes to the feature and solving a quadratic programming problem.

11. The method of any one of clauses 1 to 4, wherein the parameter constrains an amount of relaxation of the pattern layout requirement.

12. The method of any one of clauses 1 to 4, wherein the reconfiguring is performed under a constraint dictating a range of the parameter characteristic of relaxation of the pattern layout requirement.

13. The method of any one of clauses 1 to 4, wherein the parameter is an upper bound to an amount of relaxation of the pattern layout requirement.

14. The method of any one of clauses 1 to 4, wherein the reconfiguring is performed under constraints dictating a range of a change to the feature.

15. The method of any one of clauses 1 to 4, wherein the pattern layout requirement is one or more rules selected from the group consisting of: minimal space rule, minimal width rule, minimal space corner-to-corner rule and minimal corner-to-edge space rule.

16. The method of clause 11, further comprising outputting a location of the feature and the amount of relaxation of the pattern layout requirement.

17. A method of processing an exposure pattern layout for a lithographic process, the method comprising:
identifying a feature from a plurality of features of the layout, the feature violating a pattern layout requirement; and
keeping or reconfiguring the identified feature, and reconfiguring another feature from the plurality of features wherein the kept or reconfigured identified feature still violates the pattern layout requirement.

18. The method of clause 17, wherein the identified and/or the another feature is reconfigured until a termination condition is satisfied.

19. The method of clause 18, wherein the termination condition includes one or more conditions selected from the group consisting of: minimization of a cost function; maximization of a cost function; reaching a preset number of iterations; reaching a value of a cost function equal to or beyond a preset threshold value; reaching a predefined computation time; and reaching a value of a cost function within an acceptable error limit.

20. The method of any of clauses 17 to 19, further comprising determining based on a criterion whether the identified feature and/or the another feature is to be reconfigured.

21. The method of any of clauses 17 to 19, comprising evaluating a cost function of a lithographic metric affected by a change to the identified feature and/or the another feature and a parameter characteristic of relaxation of the pattern layout requirement.

22. The method of clause 21, wherein the change includes movement of a segment of a boundary of the identified feature and/or the another feature.

23. The method of clause 21 or clause 22, wherein the change includes a change of shape of the identified feature and/or the another feature.

24. The method of any of clauses 21 to 23, wherein the change includes a change of location of the identified feature and/or the another feature.

25. The method of any of clauses 21 to 24, wherein the cost function comprises a weighted sum of squares of the lithographic metric and the parameter.

26. The method of any of clauses 21 to 25, wherein the lithographic metric is one or more metrics selected from the group consisting of: resist image intensity, aerial image intensity, edge placement error, resist image difference, aerial image difference and edge placement error difference.

27. The method of any of clauses 21 to 26, wherein the cost function is minimized or maximized by a method selected from a group consisting of: the Gauss-Newton algorithm, the interpolation method, the Levenberg-Marquardt algorithm, the gradient descent algorithm, simulated annealing, interior point method, the genetic algorithm, solving polynomials of the changes to the feature and solving a quadratic programming problem.

28. The method of any of clauses 21 to 27, wherein the parameter constrains an amount of relaxation of the pattern layout requirement.

29. The method of any of clauses 17 to 28, wherein the identified feature and/or the another feature is reconfigured and the reconfiguring is performed under a constraint dictating a range of a parameter characteristic of relaxation of the pattern layout requirement.

30. The method of any of clauses 17 to 29, wherein the identified feature and/or the another feature is reconfigured and the reconfiguring is performed under constraints dictating a range of a change to the feature.

31. The method of any of clauses 17 to 30, wherein the pattern layout requirement is one or more rules selected from the group consisting of: minimal space rule, minimal width rule, minimal space corner-to-corner rule and minimal corner-to-edge space rule.

32. The method of clause 28, further comprising outputting a location of the identified feature and/or the another feature and the amount of relaxation of the pattern layout requirement.

33. A method of processing a pattern layout for a lithographic process, the method comprising:
identifying a device feature that violates a pattern layout requirement;
computing and recording relaxation of the pattern layout requirement and reconfiguration of the identified device feature by evaluating a cost function of a lithographic metric affected by a change to the device feature and a parameter characteristic of relaxation of the pattern layout requirement;
selecting from the group consisting of: applying the relaxation and the reconfiguration recorded, reconfiguring the identified device feature based on empirical rules, and not applying any reconfiguration to the identified device feature.

34. A computer program product comprising a computer readable medium having instructions recorded thereon, the instructions when executed by a computer implementing the method of any of the above claims.

35. A method for simulating an image formed within a resist layer on a substrate.

The descriptions above are intended to be illustrative, not limiting. Thus, it will be apparent to one skilled in the art that modifications may be made to the embodiments as described without departing from the scope of the claims set out below.

What is claimed is:

1. A method of processing a pattern layout for a lithographic process, the method being implemented by a computer and comprising:
   identifying a feature from a plurality of features of the layout, the feature violating a first value of a pattern layout requirement; and
   reconfiguring, by the computer, the feature, wherein the reconfigured feature still violates the first value of the pattern layout requirement but does not violate a relaxed second value of the pattern layout requirement, the reconfiguring including evaluating a cost function that jointly determines a cost associated with an amount a lithographic metric is affected by a change to the feature due to the reconfiguration and an amount of relaxation of the pattern layout requirement from the first value to the second value, wherein the reconfiguring is performed under a constraint dictating a range of the amount of relaxation of the pattern layout requirement.

2. The method of claim 1, wherein the feature is reconfigured until a termination condition is satisfied.

3. The method of claim 2, wherein the termination condition includes one or more conditions selected from the group consisting of: minimization of the cost function; maximization of the cost function; reaching a preset number of iterations; reaching a value of the cost function equal to or beyond a preset threshold value; reaching a predefined computation time; and reaching a value of the cost function within an acceptable error limit.

4. The method of claim 1, further comprising determining based on a criterion whether the feature is to be reconfigured.

5. The method of claim 1, wherein the change includes at least one selected from a group comprising:
   movement of a segment of a boundary of the feature;
   a change of shape of the feature; and
   a change of location of the feature.

6. The method of claim 1, wherein the cost function comprises a weighted sum of squares of the amounts of change of the lithographic metric and the pattern layout requirement.

7. The method of claim 1, wherein the lithographic metric is one or more metrics selected from the group consisting of: resist image intensity, aerial image intensity, edge placement error, resist image difference, aerial image difference and edge placement error difference.

8. The method of claim 1, wherein the cost function is minimized or maximized by a method selected from a group consisting of: the Gauss-Newton algorithm, the interpolation method, the Levenberg-Marquardt algorithm, the gradient descent algorithm, simulated annealing, interior point method, the genetic algorithm, solving polynomials of the changes to the feature and solving a quadratic programming problem.

9. The method of claim 1, wherein the amount of relaxation of the pattern layout requirement is constrained within a bound.

10. The method of claim 9, further comprising outputting a location of the feature and the amount of relaxation of the pattern layout requirement.

11. The method of claim 1, wherein the reconfiguring is performed under constraints dictating a range of a change to the feature.

12. The method of claim 1, wherein the pattern layout requirement is one or more rules selected from the group consisting of: minimal space rule, minimal width rule, minimal space corner-to-corner rule and minimal corner-to-edge space rule.

13. A method of processing a pattern layout for a lithographic process, the method being implemented by a computer and comprising:
   identifying a device feature that violates a first value of a pattern layout requirement;
   computing, by the computer, and recording relaxation of the pattern layout requirement and reconfiguration of the identified device feature by evaluating a cost function that jointly determines a cost associated with an amount a lithographic metric is affected by a change to the device feature due to the reconfiguration and an amount of relaxation of the pattern layout requirement from the first value to a second value, wherein the reconfiguration is performed under a constraint dictating a range of the amount of relaxation of the pattern layout requirement; and
   selecting from the group consisting of: applying the relaxation and the reconfiguration recorded, reconfiguring the identified device feature based on empirical rules, and not applying any reconfiguration to the identified device feature.

14. A computer program product comprising a non-transitory computer readable storage medium having instructions recorded thereon, the instructions when executed by a computer implementing a method comprising:
   identifying a feature from a plurality of features of the layout, the feature violating a first value of a pattern layout requirement; and
   reconfiguring, by the computer, the feature, wherein the reconfigured feature still violates the first value of the pattern layout requirement but does not violate a relaxed second value of the pattern layout requirement, the reconfiguring including cost function that jointly determines a cost associated with an amount a lithographic metric is affected by a change to the feature due to the reconfiguration and an amount of relaxation of the pattern layout requirement from the first value to the second value, wherein the reconfiguring is performed under a constraint dictating a range of the amount of relaxation of the pattern layout requirement.

* * * * *